United States Patent
Lee et al.

(10) Patent No.: US 6,613,493 B2
(45) Date of Patent: Sep. 2, 2003

(54) PHOTORESIST POLYMER AND COMPOSITION HAVING NITRO GROUPS

(75) Inventors: Geun Su Lee, Kyoungki-do (KR); Jae Chang Jung, Kyoungki-do (KR); Ki Soo Shin, Kyoungki-do (KR)

(73) Assignee: Hynix Semiconductor Inc, Kyoungki-do (KR)

( * ) Notice: Subject to any disclaimer, the term of this patent is extended or adjusted under 35 U.S.C. 154(b) by 49 days.

(21) Appl. No.: 10/037,515

(22) Filed: Jan. 4, 2002

(65) Prior Publication Data

US 2003/0013036 A1 Jan. 16, 2003

(30) Foreign Application Priority Data

Jun. 21, 2001 (KR) ............................. 2001-35467

(51) Int. Cl.[7] .................. G03F 7/004; C08L 61/06; C08G 8/16

(52) U.S. Cl. .................. 430/270.1; 430/326; 430/905; 525/328.8; 525/390; 525/480; 528/149; 528/210; 528/212

(58) Field of Search .............. 430/270.1, 326, 430/905; 528/149, 210, 212; 525/328.8, 480, 390

(56) References Cited

U.S. PATENT DOCUMENTS 5,164,278 A * 11/1992 Brunsvold et al. .......... 430/176
2001/0008739 A1 * 7/2001 Nishiyama et al.

FOREIGN PATENT DOCUMENTS

DE 2503969 * 8/1975

OTHER PUBLICATIONS

Derwent Abstract DE 2503969, Aug. 1975.*

* cited by examiner

Primary Examiner—Rosemary Ashton
(74) Attorney, Agent, or Firm—Marshall, Gerstein & Borun

(57) ABSTRACT

Photoresist polymers having nitro groups ($-NO_2$), and photoresist compositions containing the same. A photoresist pattern having excellent endurance, etching resistance, reproducibility and resolution can be formed by the use of the photoresist copolymer comprising polymerization repeating units represented by Chemical Formula 1a or 1b:

Chemical Formula 1a

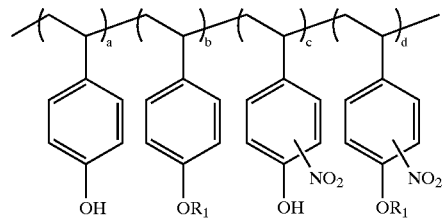

Chemical Formula 1b

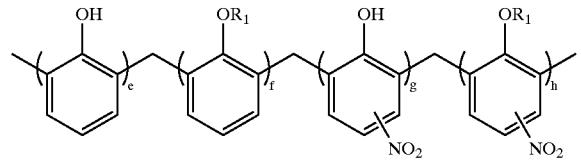

wherein, $R_1$, a, b, c, d, e, f, g and h is defined in the specification.

Having nitro groups in the polymer, the photoresist polymer results in a low absorbance in the range of 157 nm wavelength, so that it is extremely useful for a photolithography process using, in particular, VUV light source.

19 Claims, 4 Drawing Sheets

PHOTORESIST POLYMER AND COMPOSITION HAVING NITRO GROUPS

TECHNICAL FIELD

Photoresist polymers having nitro groups (—$NO_2$), and photoresist compositions containing the same are disclosed. More specifically, photoresist polymers used in a photoresist for VUV (vacuum ultraviolet processes), and photoresist compositions containing the same are disclosed.

BACKGROUND

Photoresist compositions of a chemical amplification type, which are prepared by incorporating photoresist polymers of a structure that sensitively reacts with acid, photoacid generators and organic solvents, are widely used for photolithography manufacturing semiconductors.

The reaction mechanism of the chemical amplification type photoresist is examined by referring to a positive photoresist. In the light-exposed area, the photoacid generator, as lighted by the ultraviolet light source generates acid, which releases the acid labile protecting group of the polymer and dissolved into the developing solution, while the non-exposed area, not radiated by ultraviolet light, retains its original structure even after being treated with developing solution. Thus, the image of the mask is revealed as positive pattern in the substrate.

In the photolithography process, the resolution depends on the wavelength of light source. As the wavelength of light source decreases, a smaller pattern can be formed. Thus, a photoresist suitable for such a light source is required.

In general, a photoresist polymer to be used as a photoresist for VUV processes should have low light absorbance at 157 nm wavelength, good etching resistance and adhesive property, and should be able to be developed by conventional developing solution such as 2.38 wt % or 2.6 wt % aqueous tetramethylammonium hydroxide (hereinafter, abbreviated to as "TMAH") solution.

Photoresist polymers contained in conventional photoresists (i-line (356 nm), KrF (248 nm) and ArF (193 nm)), for example, polyhydroxystyrene and novolac resin have satisfied every physical properties required for a photoresist. However, the photoresists comprising such photoresist polymers shows intense absorbance in the range of 157 nm wavelength, so they cannot be used as a photoresist for VUV.

Studies on ethylene type polymers, styrene type polymers and acrylate type polymers containing fluorine have been actively performed. However, these ethylene type polymers, styrene type polymers and acrylate type polymers containing fluorine have disadvantages of weak etching resistance, and low solubility in aqueous TMAH solution, difficulties in its development, and low adhesive property to silicon wafer. In addition, these polymers impose various problems such as difficulties of mass production and high price, thereby they are not suitable for industrial use as of yet. Further, a photoresist which comprises silicon-containing polymer cannot be suitably used as a photoresist since it induces the problem of lens contamination due to outgassing.

SUMMARY OF THE DISCLOSURE

In order to solve the problems of conventional arts as described above, nitrated polyhydroxystyrene and novolac resin are disclosed with a lower absorbance at 157 nm wavelength, and the hydrogen of the hydroxy group of the nitrated polyhydroxystyrene or nitrated novolac resin is substituted with a proper ratio of acid labile protecting group to control the solubility in developing solution, thereby providing a novel photoresist polymer and a photoresist composition containing the same, that can be used as a photoresist for VUV.

In addition, a process for forming a photoresist pattern by using said photoresist composition, and a semiconductor element obtained according to said process are also disclosed.

Thus, a novel photoresist polymer comprising a polymerization repeating unit containing nitro groups, a process for preparing the same, a photoresist composition comprising said polymer, a process for forming a photoresist pattern by the use of said composition, and a semiconductor element prepared according to said process for pattern formation are also disclosed.

BRIEF DESCRIPTION OF THE DRAWINGS

FIG. 1 is an IR spectrum of the compound represented by Chemical Formula 1a.

DETAILED DESCRIPTION OF THE PRESENTLY PREFERRED EMBODIMENTS

A polymerization repeating unit represented by Chemical Formula 1a or Chemical Formula 1b, and a photoresist copolymer comprising the repeating unit.

Chemical Formula 1a wherein, $R_1$ is an acid labile protecting group;
the ratio a+b:c+d falls within the following ranges: 0~80 mol %:20~100 mol %;
the ratio a+c:b+d falls within the following ranges: 40~80 mol %:20~60 mol %; and
the weight average molecular weight of Chemical Formula 1a ranges from about 6000 to about 30000.

Chemical Formula 1b wherein, $R_1$ is an acid labile protecting group;
the ratio e+f:g+h falls within the following ranges: 0~80 mol %:20~100 mol %;

the ratio e+g: f+h falls within the following ranges: 40~80 mol %:20~60 mol %; and the weight average molecular weight of Chemical Formula 1b ranges from about 1200 to about 10000.

Under the above condition, the amount of nitro groups contained in compound of Chemical Formula 1a or 1b, the polymerization repeating unit of the present invention, ranges from about 20 to about 100% of the number of overall benzene rings.

The acid labile protecting group is the one that can be removed by acid. In case of containing an acid labile protecting group, dissolution of photoresist by alkaline developing solution is inhibited, but in case that the labile protecting group is released by acid generated by light exposure, the photoresist can be dissolved in alkaline developing solution.

As the acid labile protecting group, any groups that can serve such a role may be used; the groups include what are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. 6,235,448 B1 (May 22, 2001) and U.S. Pat. No. 6,235,447 B1 (May 22, 2001). Preferable acid labile protecting groups include a compound represented by Chemical Formula 3, or —COOR' wherein R' is t-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, t-butoxyethyl, 1-isobutoxyethyl or 2-acetylmenth-1-yl.

Chemical Formula 3 wherein, $R_2$ is linear or branched $C_1$~$C_{10}$ alkylene with or without substituent(s); or linear or branched $C_1$~$C_{10}$ alkylene with or without substituent(s) containing ether group (—O—), and m is an integer ranging from 1 to 5.

The compound of Chemical Formula 3 preferably is 2,6-difluoro-α-methylbenzyl represented by Chemical Formula 3a.

Chemical Formula 3a

The polymerization repeating unit as described above can be prepared by the following process, which comprises the steps of:

(a) nitrating at least a part of polyhydroxystyrene or novolac resin to obtain a compound represented by Chemical Formula 2a or Chemical Formula 2b; and

(b) reacting the nitrated polyhydroxystyrene or nitrated novolac resin with a halide having acid labile protecting group(s), to substitute a part of hydrogen of the hydoxide group with acid labile protecting group(s), thereby providing polymerization repeating unit of Chemical Formula 1a or Chemical Formula 1b.

Chemical Formula 2a wherein, the ratio i:j falls within the following ranges: 0~80 mol %:20~100 mol %; and the weight average molecular weight ranges from about 5000 to about 20000.

Chemical Formula 2b wherein the ratio k:l falls within the following ranges: 0~80 mol %:20~100 mol %; and the weight average molecular weight ranges from about 1000 to about 5000.

Under the above condition, the amount of nitro groups contained in compound of Chemical Formulae 2a and 2b ranges from about 20~100% of the number of overall benzene rings, and Chemical Formulae 1a and 1b correspond to from about 20 to about 60% substitution of hydroxy group of Chemical Formulae 2a and 2b with acid labile protecting groups.

In the step (a) of the process for preparation, the process for nitrating polyhydroxystyrene or novolac resin comprises adding polyhydroxystyrene or novolac resin to a mixed solution of nitric acid and acetic acid to perform reaction. The ratio of nitro groups substitution by the reaction can be altered in the range from about 20 to about 100% of the number of overall benzene rings by controlling the mixed ratio of nitric acid to acetic acid.

The halide having acid labile protecting group employed in step (b) of the above process is preferably 2,6-difluoro-α-methylbenzyl bromide represented by Chemical Formula 4. The substitution ratio of hydrogen of hydroxyl group of nitrated polyhydroxystyrene or nitrated novolac resin with acid labile protecting group can be altered by controlling the amount of halide having the acid labile protecting group.

Chemical Formula 4

Since the polymerization repeating unit prepared as above has nitro groups, it lowers absorbance in the range of 157 nm wavelength, and can be employed as photoresist for VUV. In addition, it has proper amount of hydroxyl group, so that it can be dissolved in alkaline solvent, thereby 2.38 wt % and 2.6 wt % of aqueous TMAH solution can be used as the developing solution. Further, by virtue of hydroxyl group, adhesive property to the substrate is also excellent.

In addition, since the polymerization repeating unit has acid labile protecting group substituted in a proper ratio, it shows low solubility in the developing solution in the non-exposed region, while in the presence of acid, the protecting group is released to have high solubility in the developing solution in the exposed region, so that the contrast ratio between exposed region and non-exposed region increases to form good pattern, and the resolution noticeably increases, thereby precise pattern can be formed with less light exposure amount, to remarkably raise sensitivity.

The photoresist polymer comprises the polymerization repeating unit in the main chain, and if required, further comprises other comonomers or additives.

A photoresist composition can comprise the photoresist polymer, organic solvent and photoacid generator.

As the photoacid generator, any compound that can generate acid when exposed to light can be employed. The photoacid generator include what is disclosed by U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000), U.S. Pat. No. 6,132, 926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat No. 6,225,020 B1 (May 1, 2001), U.S. Pat. No. 6,235,448 B1 (May 22, 2001) and U.S. Pat. No. 6,235,447 B1 (May 22, 2001). A sulfide or onium type compound is mainly used.

Phthalimidotrifluoromethanesulfonate, dinitrobenzyl tosylate, n-decyldisulfone or naphthylimidotrifluoromethanesulfonate having relatively low absorbance in the wavelength of 157 nm and 193 nm is preferably employed. With the compounds, one or more compounds selected from the group consisting of diphenyliodide hexafluorophosphate, diphenyliodide hexafluoroarsenate, diphenyliodide hexafluoroantimonate, diphenyl-p-methoxyphenyl triplate, diphenyl-p-toluenyl triplate, diphenyl-p-isobutylphenyl triplate, triphenylsulfonium hexafluoroarsenate, triphenylsulfonium hexafluoroantimonate, triphenylsulfonium triplate and dibutylnaphthylsulfonium triplate can be used. The photoacid generator is preferably used in an amount ranging from about 0.05 to about 10 wt % of the photoresist polymer. If the amount is less than about 0.05 wt %, sensitivity of the photoresist to light becomes insufficient, while if it is more than about 10 wt %, the photoacid generator largely absorbs far ultraviolet to generate too much acid to deteriorate the cross section of the pattern.

As the organic solvent, any organic solvent conventionally used for the photoresist composition can be used; the solvent includes what is disclosed by the references mentioned above. Methyl 3-methoxypropionate, ethyl 3-ethoxypropionate, propylene glycol methyl ether acetate, cyclohexanone, 2-heptanone or ethyl lactate is preferably used. The amount of solvent ranges from about 500 to about 2000 wt % of the photoresist polymer, in order to obtain desired thickness of the photoresist film. For example, when 1000 wt % of organic solvent to the photoresist polymer is used, thickness of the photoresist is about 0.25 μm.

A process for forming a photoresist pattern comprises:
(a) coating the photoresist composition according to the present invention on underlying layer to form a photoresist film,
(b) light-exposing said photoresist film, and
(c) developing the light-exposed photoresist film to obtain a photoresist pattern.

The process can further comprise soft baking before light-exposure of step (b), or post baking after light-exposure of step (b). Baking is preferably carried out at a temperature ranging from about 70 to about 200° C.

The light-exposure process can be carried out with about 1 to about 100 mJ/cm² of light-exposure energy by using ArF (193 nm), KrF (248 nm), E-beam, EUV (extreme ultraviolet) or ion beam as well as VUV (157 nm).

The developing step (c) is carried out by using alkaline developing solution, which preferably is from about 0.01 to about 5 wt % aqueous TMAH solution.

A semiconductor element prepared can be by the use of the photoresist composition as described herein.

The disclosed polymers and photoresist compositions will now be described in more detail by referring to the examples below, but it should be noticed that these examples are described simply in order to illustrate the disclosed polymers and photoresist compositions which are not restricted to the examples by any means.

I. Preparation of Photoresist Polymer

EXAMPLE 1

Preparation of Compound of Chemical Formula 1a (Stage 1) Preparation of Compound of Chemical Formula 2a:

Polyhydroxystyrene (10 g) having weight average molecular weight of 8000 was added to a mixed solution of 20% dilute nitric acid (50 ml) and acetic acid (20 ml), and the resultant mixture was reacted at 60° C. for 24 hours. When the reaction was completed, the reaction mixture was cooled to room temperature and filtered with washing several times with water in order to remove acid. The obtained crystals were dried under vacuum to give pure polyhydroxystyrene having nitro substituent, which is represented by Chemical Formula 2a (yield: 98%).

(Stage 2) Preparation of Compound of Chemical Formula 1a:

Polyhydroxystyrene (8.3 g) having nitro substituent obtained from Stage 1 above and potassium hydroxide (KOH, 2.8 g) were added to ethanol (60 ml), and the mixture was stirred for 2 hours. Then 2,6-difluoro-α-methylbenzyl bromide (7.9 g) of Chemical Formula 3a was added thereto, and the resultant mixture was stirred at 50° C. for another 12 hours. To the reaction mixture, 1N dilute hydrochloric acid (10 ml) was added, and the resultant mixture was filtered with washing several times with water in order to completely remove potassium bromide (KBr) and hydrochloric acid. The obtained resin is dried to obtain compound represented by Chemical Formula 1a, which is polyhydroxystyrene having 2,6-difluoro-a-methylbenzyl substituent (yield: 96%).

Figure 1:
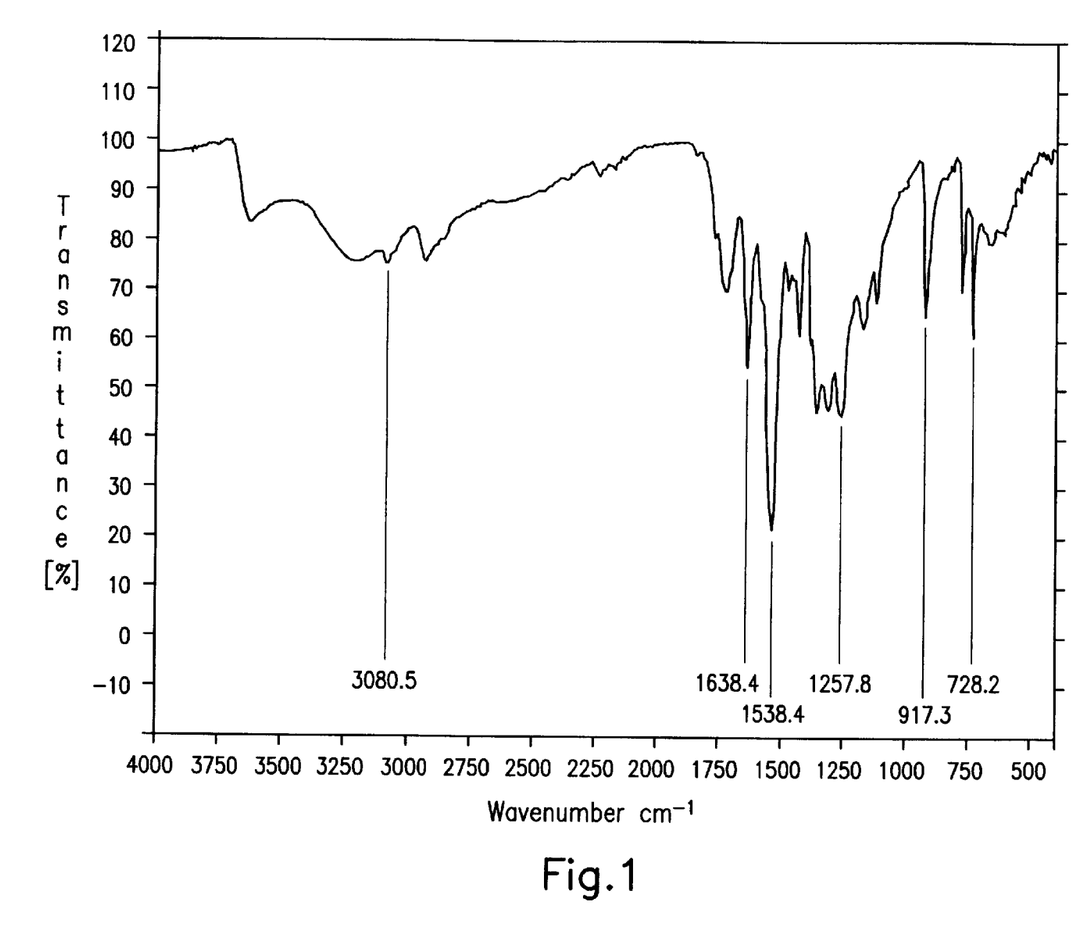

The generation of compound of Chemical Formula 1a was confirmed by IR spectrum of FIG. 1.

EXAMPLE 2

Preparation of Compound of Chemical Formula 1b (Stage 1) Preparation of Compound of Chemical Formula 2b:

Novolac resin (10 g) having weight average molecular weight of 2000 was added to a mixed solution of 20% dilute nitric acid (50 ml) and acetic acid (50 ml), and the resultant mixture was reacted at 50° C. for 24 hours. When the reaction was completed, the reaction mixture was cooled to room temperature and filtered with washing several times with water in order to remove acid. The obtained crystals were dried under vacuum to give pure novolac resin having nitro substituent, which is represented by Chemical Formula 2b (yield: 98%).

(Stage 2) Preparation of Compound of Chemical Formula 1b:

Novolac resin (8.3 g) having nitro substituent obtained from Stage 1 above and potassium hydroxide (KOH, 2.8 g) were added to ethanol (60 ml), and the mixture was stirred for 2 hours. Then 2,6-difluoro-α-methylbenzyl bromide (7.9 g) of Chemical Formula 3a was added thereto, and the resultant mixture was stirred at 50° C. for another 12 hours. To the reaction mixture, 1N dilute hydrochloric acid (10 ml) was added, and the resultant mixture was filtered with washing several times with water in order to completely remove potassium bromide (KBr) and hydrochloric acid. The obtained resin is dried to obtain the compound represented by Chemical Formula 1b, that is novolac resin having 2,6-difluoro-α-methylbenzyl substituent (yield: 94%).

Figure 2:
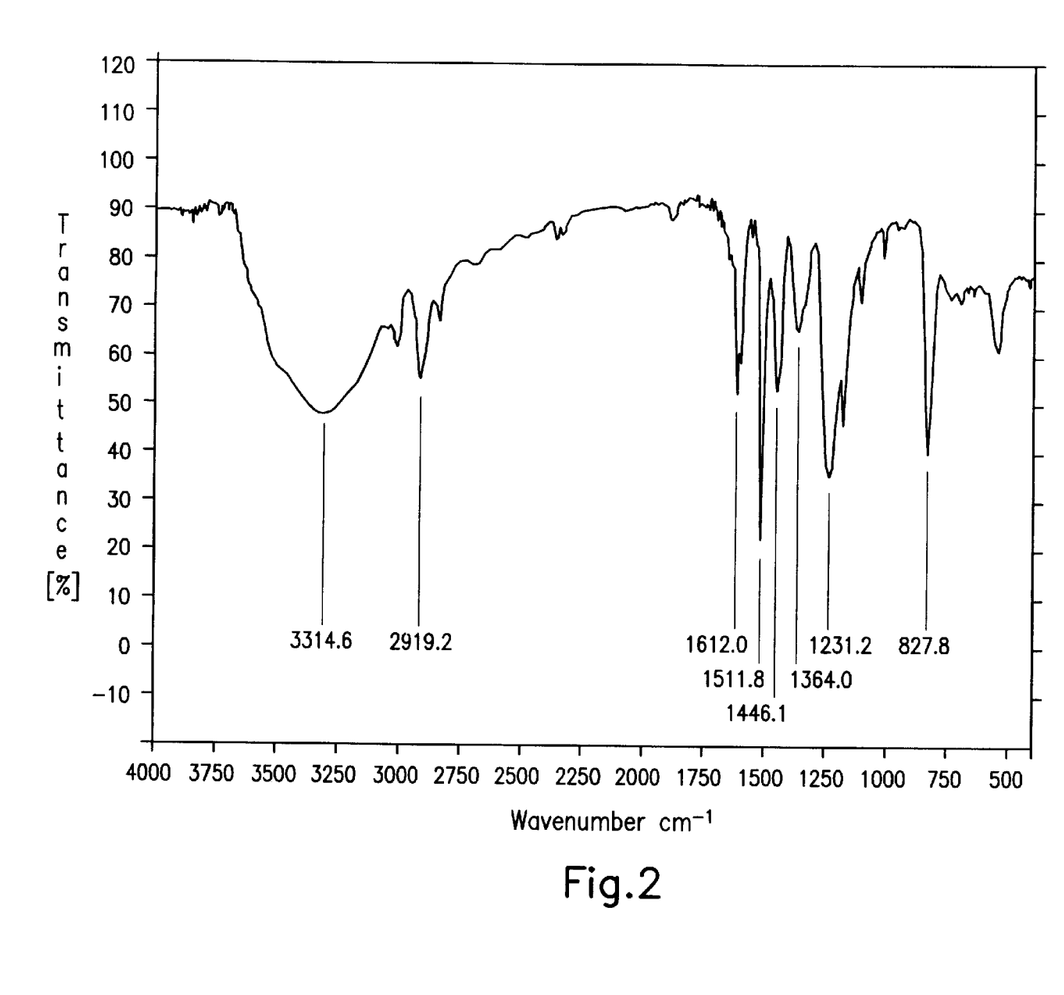
FIG. 2 is an IR spectrum of the compound represented by Chemical Formula 1b.

The generation of compound of Chemical Formula 1b was confirmed by IR spectrum of FIG. 2.

II. Preparation of Photoresist Composition and Pattern Formation

EXAMPLE 3

Preparation of Photoresist Composition and Formation of Photoresist Pattern (1)

The photoresist polymer (polyhydroxystyrene having 2,6-difluoro-α-methylbenzyl substituent) obtained from Example 1 (10 g), phthalimidotrifluoromethanesulfonate (0.06 g) and triphenylsulfonium triplate (0.06 g) as a photoacid generator were dissolved in 80 g of propyleneglycol methyl ether acetate (PGMEA) as organic solvent, and the solution was filtered through 0.20 μm filter to obtain photoresist composition.

Figure 3:
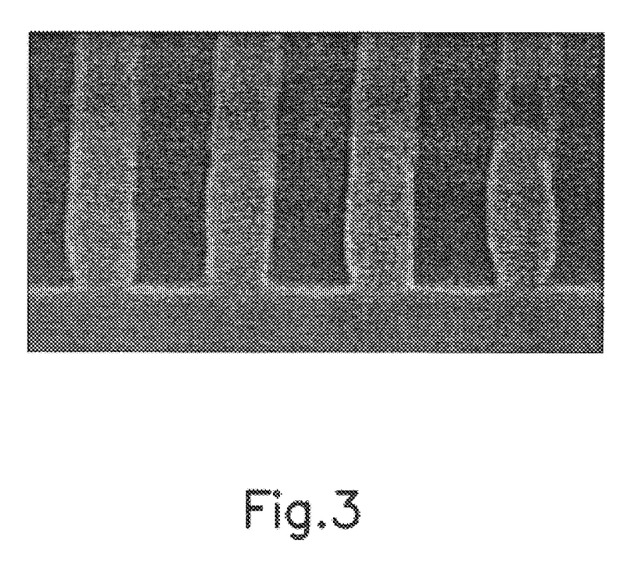
FIG. 3 is a photograph of the photoresist pattern formed by Example 3 of the detailed description.

The photoresist composition was spin-coated on a silicon wafer, and the wafer was baked at 110° C. for 90 seconds. After baking, the coated wafer was light-exposed by using KrF laser exposure device, and further baked at 110° C. for 90 seconds. After baking was completed, it was developed in 2.38 wt % aqueous TMAH solution for 40 seconds to give L/S pattern of 0.14 μm (see FIG. 3).

EXAMPLE

Preparation of Photoresist Composition and Formation of Photoresist Pattern (2)

The photoresist polymer (novolac resin having 2,6-difluoro-α-methylbenzyl substituent) obtained from Example 2 (10 g), phthalimidotrifluoromethanesulfonate (0.06 g) and triphenylsulfonium triplate (0.06 g) as a photoacid generator were dissolved in 80 g of propyleneglycol methyl ether acetate (PGMEA) as organic solvent, and the solution was filtered through 0.20 μm filter to obtain photoresist composition.

Figure 4:
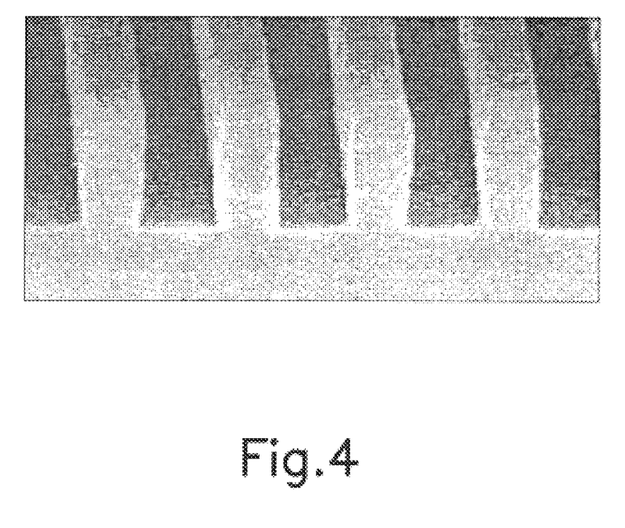
FIG. 4 is a photograph of the photoresist pattern formed by Example 4 of the detailed description.

The photoresist composition was spin-coated on a silicon wafer, and the wafer was baked at 110° C. for 90 seconds. After baking, the coated wafer was light-exposed by using KrF laser exposure device, and further baked at 110° C. for 90 seconds. After baking was completed, it was developed in 2.38 wt % aqueous TMAH solution for 40 seconds to give L/S pattern of 0.13 μm (see FIG. 4).

EXPERIMENTAL EXAMPLE

Examination of Absorbance at 157 nm

Figure 5:
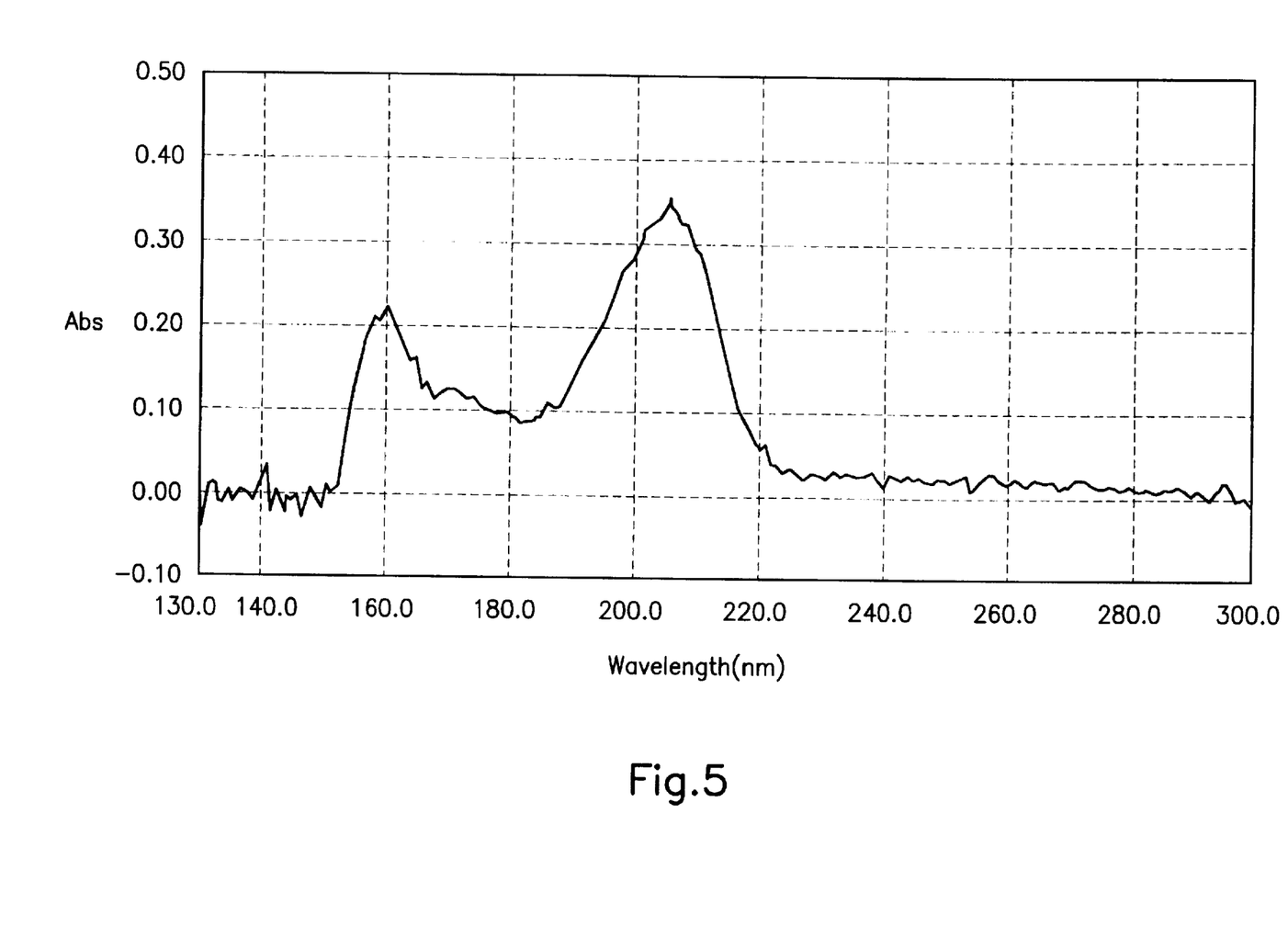
FIG. 5 is a VUV spectrum of the photoresist composition according to Example 4 of the detailed description.

Absorbance of photoresist composition obtained from Example 4 coated in a thickness of 2500 Å was showed in IR spectrum of FIG. 5. According to FIG. 5, the absorbance of the photoresist composition of Example 4 at 157 nm wavelength was 0.23, which is merely half of the absorbance of conventional photoresist for KrF or ArF light source at 157 nm. Thus, the conventional photoresist composition should be coated in a thickness of 600~700 Å or less to satisfy the requisite of light transmission for a lithography process employing 157 nm light source, while the photoresist composition according to the present invention, having high light transmission for 157 nm light source, can provide efficient pattern even when it is coated in a thickness of 1200 Å or more. The photoresist composition according to the present invention ensures enhanced etching resistance, as it allows formation of photoresist film in a sufficient thickness.

From the Experimental Example, it is noticed that the composition comprising the photoresist polymer according to the present invention has excellent light transmission at 157 nm wavelength, so that it can be usefully employed for a photolithography process using 157 nm light source. In addition, from Examples 3 and 4, it is ascertained that the photoresist composition comprising the photoresist polymer according to the present invention has effective physical property as a photoresist.

As can be seen from the above Examples and Experimental Example, a photoresist pattern having excellent endurance, etching resistance, reproducibility and resolution can be formed by the use of the photoresist composition according to the disclosure, and the composition can be employed for ultramicro pattern formation of 4G, 16G DRAM or more, not to mention of 1G DRAM or less. The photoresist polymer of the disclosure contains nitro groups, so that absorbance at the range of 157 nm is lowered, thereby it can be very usefully employed in a photolithography process, particularly using VUV light source.

What is claimed:

1. A photoresist polymer comprising polymerization repeating unit selected from the group consisting of compounds of Chemical Formula 1a and Chemical Formula 1b:

wherein, $R_1$ is an acid labile protecting group;

the ratio a+b:c+d falls within the following range: 0~80 mol %:20~100 mol %;

the ratio a+c:b+d falls within the following range: 40~80 mol %:20~60 mol %;

the ratio e+f:g+h falls within the following range: 0~80 mol %:20~100 mol %;

the ratio e+g:f+h falls within the following range: 40~80 mol %:20~60 mol %;

the weight average molecular weight of Chemical Formula 1a ranges from about 6000 to about 30000; and the weight average molecular weight of Chemical Formula 1b ranges from about 1200 to about 10000.

2. The photoresist polymer according to claim 1, wherein the acid labile protecting group is the compound of Chemical Formula 3 or COOR', wherein R' is selected from the group consisting of t-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, t-butoxyethyl, 1-isobutoxyethyl and 2-acetylmenth-1-yl; and

Chemical Formula 3

$R_2$ is linear or branched $C_1$~$C_{10}$ alkylene with or without substituent(s); or linear or branched $C_1$~$C_{10}$ alkylene with or without substituent(s) containing ether group (—O—), and m is an integer ranging from 1 to 5.

3. The photoresist polymer according to claim 2, wherein the compound of Chemical 3 is represented by following Chemical Formula 3a Chemical Formula 3a 4. A process for preparing a photoresist polymer comprising the steps of:
(a) nitrating at least a part of polyhydroxystyrene or novolac resin to obtain a compound of Chemical Formula 2a or Chemical Formula 2b; and
(b) reacting the nitrated polyhydroxystyrene or nitrated novolac resin with a halide comprising an acid labile protecting group, to substitute a part of hydrogen of the hydoxide group with the acid labile protecting group, thereby providing polymerization repeating unit of Chemical Formula 1a or Chemical Formula 1b

Chemical Formula 1a

Chemical Formula 1b

Chemical Formula 2a

ChemicaL Formula 2b wherein, $R_1$ is an acid labile protecting group;

the ratio a+b:c+d falls within the following range: 0~80 mol %:20~100 mol %;

the ratio a+c:b+d falls within the following range: 40~80 mol %:20~60 mol %;

the ratio e+f:g+h falls within the following range: 0~80 mol %:20~100 mol %;

the ratio e+g:f+h falls within the following range: 40~80 mol %:20~60 mol %;

the ratio i:j falls within the following range: 0~80 mol %:20~100 mol %;

the ratio k:l falls within the following range: 0~80 mol %:20~100 mol %;

the weight average molecular weight of Chemical Formula 1a ranges from about 6000 to about 30000; the weight average molecular weight of Chemical Formula 1b ranges from about 1200 to about 10000; the weight average molecular weight of Chemical formula 2a ranges from about 5000 to about 20000; and the weight average molecular weight of Chemical Formula 2b ranges from about 1000 to about 5000.

5. The process for preparing a photoresist polymer according to claim 4, wherein the halide comprising an acid abile protecting group is the compound represented by following Chemical Formula 4

Chemical Formula 4

6. A photoresist composition comprising the photoresist polymer according to claim 1, a photoacid generator and an organic solvent.

7. The photoresist composition according to claim 6, wherein the photoacid generator is selected from the group consisting of phthalimidotrifluoromethanesulfonate, dinitrobenzyltosylate, n-decyldisulfone, naphthylimidotrifluoromethanesulfonate and mixtures thereof.

8. The photoresist composition according to claim 7, wherein the photoacid generator further comprises a compound selected from the group consisting of diphenyl iodide hexafluorophosphate, diphenyliodide hexafluoroarsenate, diphenyliodide hexafluoroantimonate, diphenyl-p-methoxyphenyl triplate, diphenyl-p-toluenyl triplate, diphenyl-p-isobutylphenyl triplate, triphenylsulfonium hexafluoroarsenate, triphenylsulfonium hexafluoroantimonate, triphenylsulfonium triplate, dibutylnaphthylsulfonium triplate and mixtures thereof.

9. The photoresist composition according to claim 6, wherein the photoacid generator is used in an amount ranging from about 0.05 to about 10% by weight of the photoresist polymer.

10. The photoresist composition according to claim 6, wherein the organic solvent is selected from the group consisting of methyl 3-methoxypropionate, ethyl 3-ethoxypropionate, propyleneglycol methyl ether acetate, cyclohexanone, 2-heptanone, ethyl lactate and mixtures thereof.

11. The photoresist composition according to claim 6, wherein the organic solvent is used in an amount ranging from about 500 to about 2000% by weight of the photoresist polymer.

12. A process for forming a photoresist pattern comprising the steps of:

(a) coating the photoresist composition of claim 6 on underlying layer to form a photoresist film, (b) light-exposing the photoresist film, and (c) developing the light-exposed photoresist film to obtain a photoresist pattern.

13. The process for forming a photoresist pattern according to claim 12, wherein a soft baking is carried out before the light exposure of step (b), or a post baking after the light exposure of step (b).

14. The process for forming a photoresist pattern according to claim 13, wherein the baking is carried out at a temperature ranging from about 70 to about 200° C.

15. The process for forming a photoresist pattern according to claim 12, wherein the light exposure is performed by the use of a light source selected from the group consisting of VUV (vacuum ultraviolet; 157 nm), ArF (193 nm), KrF (248 nm), E-beam, EUV (extreme ultraviolet) and ion beam.

16. The process for forming a photoresist pattern according to claim 12, wherein the light exposure is performed by a light exposure energy ranging from about 1 to about 100 mJ/cm$^2$.

17. The process for forming a photoresist pattern according to claim 12, wherein the developing step (c) is carried out by using an alkaline developing solution.

18. The process for forming a photoresist pattern according to claim 17, wherein the alkaline developing solution ranging from about 0.01 to about 5% by weight aqueous tetramethylammonium hydroxide (TMAH).

19. A semiconductor element manufactured by using the process according to claim 12.

* * * * *